United States Patent
Schulz-Harder et al.

(10) Patent No.: US 7,811,655 B2
(45) Date of Patent: Oct. 12, 2010

(54) METAL-CERAMIC SUBSTRATE

(75) Inventors: Jurgen Schulz-Harder, Lauf (DE);
Karl Exel, Rimbach (DE)

(73) Assignee: Curamic Electronics GmbH, Eschenbach (DE)

( * ) Notice: Subject to any disclaimer, the term of this patent is extended or adjusted under 35 U.S.C. 154(b) by 227 days.

(21) Appl. No.: 11/631,640

(22) PCT Filed: Apr. 23, 2005

(86) PCT No.: PCT/DE2005/000751

§ 371 (c)(1),
(2), (4) Date: May 25, 2007

(87) PCT Pub. No.: WO2006/005280

PCT Pub. Date: Jan. 19, 2006

(65) Prior Publication Data

US 2007/0264463 A1 Nov. 15, 2007

(30) Foreign Application Priority Data

Jul. 8, 2004 (DE) .................. 10 2004 033 227

(51) Int. Cl.
*B32B 15/04* (2006.01)
*B32B 9/00* (2006.01)

(52) U.S. Cl. .............. 428/172; 428/457; 428/469; 428/472; 428/901

(58) Field of Classification Search ............ 428/156, 428/167, 457, 901, 469–472, 172; 228/122.1, 228/903
See application file for complete search history.

(56) References Cited

U.S. PATENT DOCUMENTS

| 4,693,409 A | 9/1987 | Mizunoya et al. |
| 5,675,181 A | 10/1997 | Nishiura et al. |
| 5,986,218 A * | 11/1999 | Muto et al. ............ 174/261 |

FOREIGN PATENT DOCUMENTS

| DE | 4004844 | 1/1991 |
| DE | 4004844 C1 * | 1/1991 |
| EP | 0798781 | 10/1997 |

* cited by examiner

*Primary Examiner*—David R Sample
*Assistant Examiner*—Catherine Simone
(74) *Attorney, Agent, or Firm*—Hoffman, Wasson & Gitler, P.C.

(57) ABSTRACT

Disclosed is a metal-ceramic substrate made up of at least one ceramic layer which is provided with metallizations on both faces. In order to obtain a partial discharge resistance of less than 10 pC at a predefined measuring voltage, the thickness of the ceramic layer amounts to about one sixth of the measuring voltage.

13 Claims, 3 Drawing Sheets

METAL-CERAMIC SUBSTRATE

BACKGROUND OF THE INVENTION

The invention relates to a metal-ceramic substrate with at least one ceramic layer, with metallizations on both sides of the ceramic layer wherein the metallizations are directly bonded with the ceramic layer.

Metal-ceramic substrates, in particular copper-ceramic substrates, are used increasingly as a base substrate or printed circuit board in power modules designed for higher operating voltages, e.g. for operating voltages of 600 V and higher. One of the requirements of such power modules is a sufficiently high discharge or partial discharge resistance or stability. This requirement corresponds to the knowledge that partial discharges, which occur during operation of such a module over an extended period, cause electrically conductive paths in the isolating areas of the module, which can weaken the isolation and eventually also cause extreme voltage punctures, resulting in the failure of the respective module.

The requirement for the highest possible partial discharge resistance or stability applies to the entire module, i.e. each individual component of the module must fulfill the requirement for the highest possible partial discharge resistance or stability. Since the respective metal-ceramic substrate is an essential component of the respective module, this requirement also applies to this substrate, although partial discharges that occur only within the metal-ceramic substrate cause no damage to the isolating effect there. The reason for the requirement for each individual component to have the necessary partial discharge resistance or stability is, for example, that it cannot be determined by measurements of the finished module which individual component of the module is responsible for partial discharges in the module.

The measurement of the partial discharge resistance or stability is defined in standard IEC 1278. According to this measuring principle, the respective test piece is first subjected in a first measuring or test phase to an isolation voltage that is considerably higher than the operating voltage and then, in a second measuring or test phase, is first subjected to a reduced, preparatory measuring voltage and finally to the actual measuring or test voltage, at which the partial discharge is then measured. The preparatory or first test voltage is then above the maximum operating voltage of the respective module and the actual test voltage is below the maximum operating voltage of the module. The discharge or partial discharge may not exceed a value of 10 pico Coulomb (10 pC) in this measurement.

In the production of metal-ceramic substrates, a method is known for manufacturing the metallization required for strip conductors, connectors, etc. on a ceramic, e.g. on an aluminum-oxide ceramic, by means of the "direct bonding" process or for metallizations made of copper by means of "DCB" (Direct Copper Bonding) technology, the metallization being formed from metal or copper sheets, the surfaces of which comprise a layer or a coat (hot-melt layer) resulting from a chemical bond between the metal and a reactive gas, preferably oxygen.

In this method, which is described for example in US-PS 37 44 120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

The DCB process then comprises, for example, the following process steps:
- oxidation of a copper foil so as to produce an even copper oxide layer;
- placing the copper foil on the ceramic layer;
- heating the composite to a process temperature between approx. 1025 and 1083° C., e.g. to approx. 1071° C.;
- cooling to room temperature.

It is an object of the invention is to present a metal-ceramic substrate that reliably complies with the required partial discharge resistance or stability of <10 pC. This object is achieved by a metal-ceramic substrate according to claim 1.

SUMMARY OF THE INVENTION

In the metal-ceramic substrate according to the invention, the metallizations are formed for example from metal foils, for example from foils made of copper or copper alloys. The bond between the respective ceramic layer and the metallization is then for example achieved using the direct bonding process, for example the DCB process.

"Metal-ceramic substrate" according to the present invention refers generally to a substrate or a sequence of layers comprising at least one ceramic layer and at least one metallization provided on at least one surface side of the ceramic layer. "Bond" according to the present invention is the surface area of the transition between the respective metallization and the ceramic layer, which (surface area) does not exhibit defective spots and on which therefore a direct bond of the metal layer to the ceramic exists.

The metallizations are bonded to the ceramic layer with a bond strength of at least 25 N/cm, which can easily be achieved with DCB technology. The bond strength of the metallizations on the ceramic layer can be determined by a standardized measuring process. For this purpose, a test substrate is manufactured, consisting of one rectangular ceramic layer and one metallization formed by one copper foil applied to one surface side of the ceramic layer by means of DCB technology. In the proximity of one end the ceramic layer is provided crossways with a break-off line, for example by means of a laser. To measure the bond strength, the ceramic layer is broken along the break-off line and then the respective end of the ceramic layer is curved upward. The remainder of the ceramic layer is placed flat on an underlying surface and fixed there. A pull-off force is exerted vertically upward on the end that is curved upward. The bond strength is then the quotient of the vertical force required for detaching or pulling off the metal layer from the ceramic layer and the width of the strip-shaped test substrate.

BRIEF DESCRIPTION OF THE DRAWINGS

The invention is explained below in more detail based on one exemplary embodiment with reference to the drawings, wherein.

DETAILED DESCRIPTION OF THE INVENTION

Figure 1:
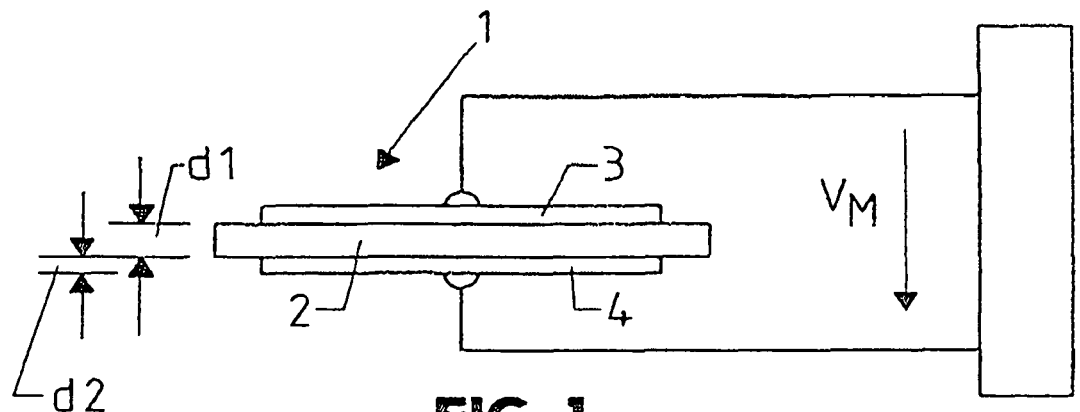
FIG. 1 shows a very schematic representation of a metal-ceramic substrate, together with a measuring array for measuring the partial discharge resistance or stability of the substrate.
Figure 3:
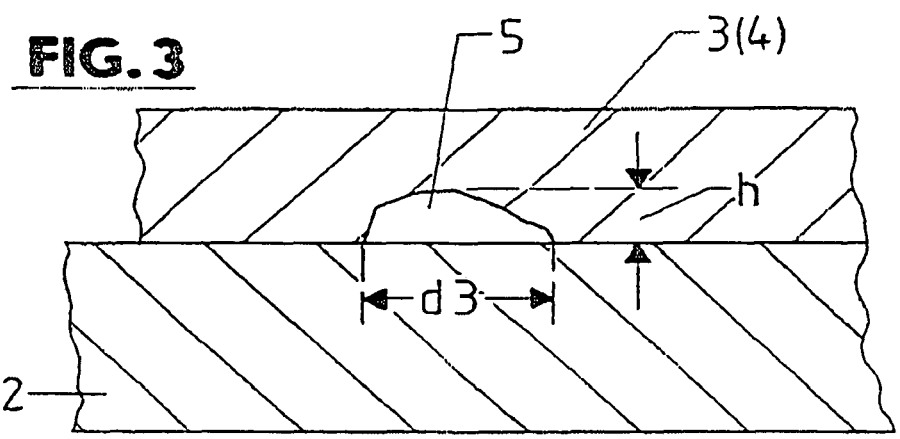
FIG. 3 shows a simplified representation of a partial cross section through a metal-ceramic substrate in the bond area between one metallization and the ceramic, namely in the proximity of a defective spot.

In the drawings, 1 is a metal-ceramic substrate consisting of one ceramic layer 2, to each side of which one metallization 3 and 4 is applied, respectively. The ceramic layer 2 has a thickness $d_1$. The surface F covered by the metallizations 3 and 4 respectively of the two surface sides of the ceramic layer 2 is somewhat smaller in the depicted embodiment than the total surface of said surface sides.

The ceramic layer 2 is made for example of $Al_2O_3$ or of a non-oxide ceramic, such as AlN or $Si_3N_4$. Ceramic materials with additives are also suitable for the ceramic layer 2, for example $Al_2O_3$ reinforced with $ZrO_2$ and/or with additives from the group of ceroxide, yttrium oxide, magnesium oxide and/or calcium oxide, in which case the ceramic material of the ceramic layer 2 then has the following composition, for example:

| | |
|---|---|
| $Al_2O_3$ | 70-98 percent by weight |
| $ZrO_2$ | 2-30 percent by weight and |
| other additives | 1-10 percent by weight, | and the other additives are formed by at least one oxide from the following group: ceroxide, yttrium oxide, magnesium oxide and calcium oxide.

The two metallizations 3 and 4 are each formed for example from a copper foil and have a thickness $d_2$. Furthermore, the metallizations 3 and 4 are bonded with the ceramic layer 2 by means of a suitable technology, for example by direct bonding technology. If the ceramic layer 2 in this case is made of a non-oxide ceramic, such as AlN or $Si_3N_4$, then this ceramic layer 2 is provided with a surface coating made of $Al_2O_3$ at least on the two surface sides, and the maximum thickness of said surface coating is 10 μm. This surface coating then makes it possible, also with the use of the aforementioned non-oxide ceramics, to attach the metallizations 3 and 4 flat on the ceramic layer 2 using the DCB process.

Figure 2:
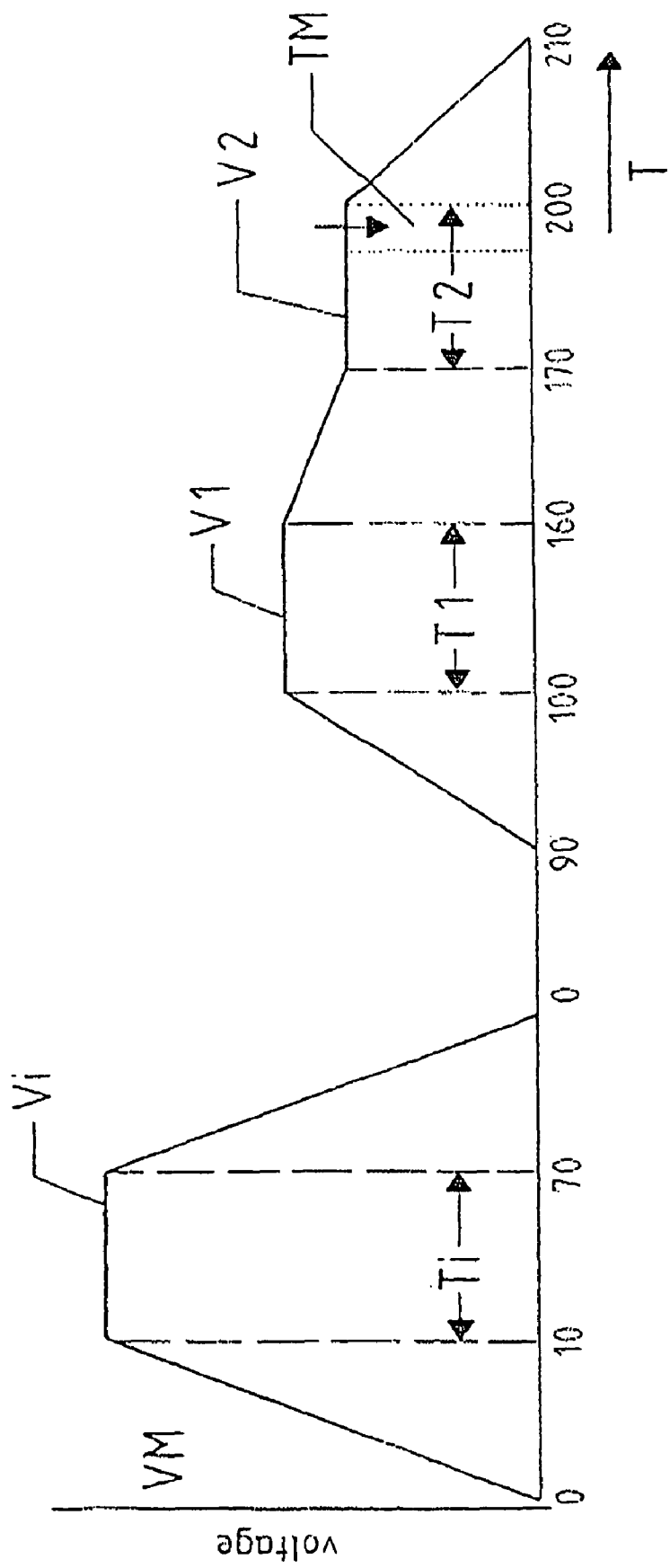
FIG. 2 shows the time curve for the measuring voltage $V_M$ according to the standardized measuring method pursuant to IEC 1287.
Figure 5:
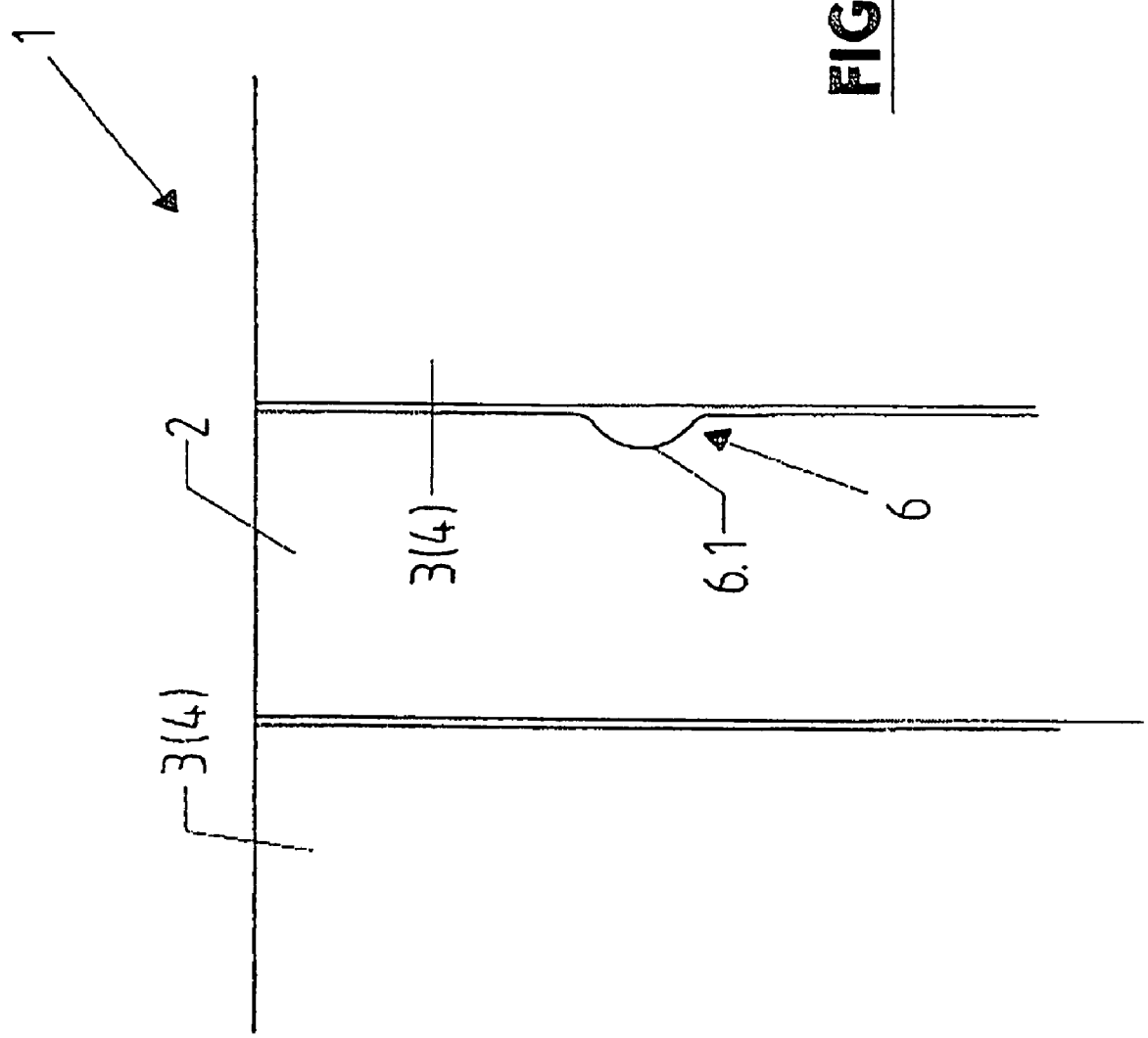

FIG. 2 shows the basic curve of the direct current measuring voltage $V_M$ applied to the metallizations 3 and 4 during the test of the discharge characteristic or discharge resistance or stability. The entire measuring process essentially comprises the two phases I and II, which are conducted consecutively in time. In the measuring phase I, the measuring voltage $V_M$ is increased starting with the time 0 to a value $V_i$ (isolation voltage) specified by the measuring method, namely within approximately 10 seconds, then is held at the value $V_i$ for a duration $T_i$ of approximately 60 seconds and then continually lowered, so that the first measuring phase I is completed after approximately 80 seconds, during which essentially the dielectric strength of the metal-ceramic substrate 1 was tested.

If the metal-ceramic substrate passes this first measuring phase I, then measuring phase II is started automatically, i.e. approximately 10 seconds after the measuring voltage $V_M$ in the first measuring phase again has the value zero, by increasing the measuring voltage $V_M$ within a pre-defined period, for example within 10 seconds, from zero to the value $V_1$ and then is held at this value for a time period $T_1$ of for example 60 seconds. Afterwards, the measuring voltage $V_M$ is reduced to a value $V_2$ and held constantly at this value for a pre-defined duration $T_2$. Before expiration of the time period $T_2$, the partial discharge is measured in a pre-defined measuring interval $T_M$, which is considerably shorter than the time period $T_2$. After this measurement, the measuring voltage $V_M$ is again continually reduced until it reaches the value zero.

To ensure that a component or module which uses the metal-ceramic substrate 1, obviously then with structured metallizations 3 and 4, as a printed circuit board, on which active and/or passive electric components are provided, also has the required discharge characteristic or discharge or partial discharge resistance or stability as a whole, it is specified that the total partial discharge throughout the duration of the measuring process $T_M$ must not exceed 10 pico Coulomb (10 pC).

As FIG. 2 shows, the isolation voltage $V_i$ is considerably higher than the voltage $V_1$. The latter is also greater than the voltage $V_2$, with which the partial discharge stability is then also measured. The absolute values $V_i$, $V_1$ and $V_2$ are based on the respective maximum operating voltage of the module containing the metal-ceramic substrate 1.

The following table lists the voltages $V_i$, $V_1$ and $V_2$ for modules with different operating voltages.

| Module type maximum operating voltage in volts | Isolation voltage $V_2$ in volts | Measuring voltage $V_2$ in volts | Measuring voltage $V_2$ in volts | Maximum partial discharge in pC |
|---|---|---|---|---|
| 600 | 2500 | 700 | 500 | 10 |
| 1200 | 2500 | 1300 | 1000 | 10 |
| 1700 | 4000 | 1800 | 1300 | 10 |
| 1800 | 4000 | 1900 | 1400 | 10 |
| 3300 | 6000 | 3500 | 2600 | 10 |
| 6500 | 10500 | 6900 | 5100 | 10 |

For the partial discharge resistance or stability and for compliance with the limit value of less than 10 pC for the partial discharge, the thickness $d_1$ of the ceramic layer 2 is critical, and always based on the type of ceramic material for this layer. The limit value of less than 10 pC for the partial discharge at the voltage $V_2$ can then easily be complied with if the voltage $V_2$ and the thickness $d_1$ conform to the following function:

$$V_{2(<10pC)} \leq 6.1 \times d_1[KV] \text{ or } d_{1(<10pC)} \geq 1/6.1 \times V_2[KV]$$

where $d_1$ is specified in mm and 6.1 is a factor in KV/mm.

Furthermore, the invention is based on the knowledge that the surface area occupied by the metallizations is a further significant parameter affecting the partial discharge resistance or stability and that it is advantageous for this reason to limit the surfaces formed by the metallizations 3 and 4 to a maximum of 110 cm² for the respective metal-ceramic substrate 1 of a module.

A further critical parameter for the partial discharge resistance or stability is the existence of any defective spots 5 in the form of hollow spaces at the transition between the respective metallization 3 or 4 and the ceramic layer 2, although such defective spots with a diameter $d_3$ smaller than 50 μm and a height h smaller than 50 μm do not affect the partial discharge resistance or stability, as long as the total surface area of the defective spots 5 in relation to the total surface area occupied by the respective metallization 3 or 4 is 5% or less.

Figure 4:
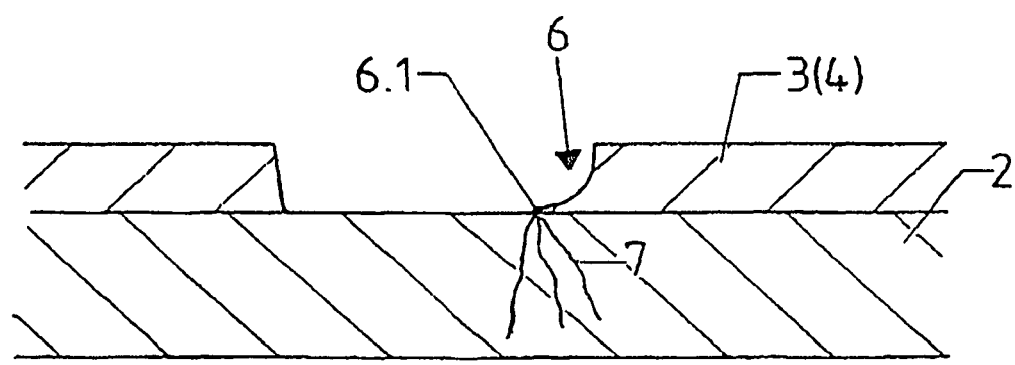
FIGS. 4 and 5 each show a partial representation in cross section and in top view of a metal-ceramic substrate with a structured metallization in the proximity of a defective spot.

In addition to these defective spots 5 formed at the transition between the ceramic layer 2 and the respective metallization 3 or 4, the partial discharge resistance or stability is also affected by defective spots 6, which occur for example during structuring of the metallizations 3 and 4 with the use of known technologies, for example etch-masking technology, specifically for example by the fact that the structured metallization forms pits and/or peaks or projections directly on the surface of the ceramic layer 2, causing areas with an increased electric field strength or a concentration of electric field lines in the ceramic layer, as indicated schematically in FIG. 4 by the lines 7. This effect of reducing the partial discharge resistance or stability by such defective spots 6 occurring during the structuring can be reduced according to a further finding of the invention if the course of the edge 6.1 with the respective defective spot 6 on the surface side of the ceramic layer 2 has a radius of curvature of at least 80 μm.

The invention was described above based on exemplary embodiments. It goes without saying that modifications and variations are possible without abandoning the underlying inventive idea upon which the invention is based.

REFERENCE LIST

1 metal-ceramic substrate
2 ceramic layer
3, 4 metal layer or metallization
5, 6 defective spot
6.1 edge of defective spot 6
7 field lines
$d_1$ thickness of the ceramic layer 2
$d_2$ thickness of the metallizations
$d_3$ diameter of defective spot
h height of defective spot
$T_i$, $T_1$, $T_2$ time interval
$T_M$ duration of measurement
$V_M$ measuring voltage
$V_i$, $V_1$, $V_2$ value of the measuring voltage

What is claimed is:

1. A metal-ceramic substrate with at least one ceramic layer, with metallizations on both surface sides of the ceramic layer, wherein the metallizations are directly bonded with the ceramic layer by direct copper bonding and the metallizations have a thickness ($d_2$) between approximately 0.1-1.0 mm, the metal ceramic substrate having a partial discharge stability or resistance of less than 10 pC for a pre-defined measuring voltage ($V_2$), the thickness ($d_1$) of the ceramic layer and the measuring voltage ($V_2$) correspond to the formula $$V_2 \leq 6.1 \times d_1, \text{ or } d_1 \geq 1/6.1 \times V_2$$

where $V_2$ is specified in KV and $d_1$ in mm, wherein the bond of the respective metallization to the ceramic is greater than 95%, and wherein defective spots forming hollow spaces at a transition between the metallization and the ceramic layer do not exceed a diameter ($d_3$) of 50 μm and a height (h) of 50 μm.

2. The metal-ceramic substrate according to claim 1, wherein the metallizations are bonded with the ceramic layer with a bond strength of at least 25 N/cm.

3. The metal-ceramic substrate according to claim 1, wherein the thickness ($d_1$) of the ceramic layer is between approximately 0.3 and 2.0 mm.

4. The metal-ceramic substrate according to claim 1, wherein a maximum surface area occupied by the respective metallization is no more than 100 cm².

5. The metal-ceramic substrate according to claim 1, wherein the metallizations are made of copper.

6. The metal-ceramic substrate according to claim 1, wherein the ceramic layer is made of $Al_2O_3$ or AlN.

7. The metal-ceramic substrate according to claim 1, wherein an intermediate layer of $Al_2O_3$ is applied to at least one surface side of the ceramic layer, with a thickness of less than 10 μm.

8. The metal-ceramic substrate as claimed in claim 1, wherein the ceramic layer is made of $Si_3N_4$.

9. The metal-ceramic substrate according to claim 1, wherein defective spots formed by the structured metallization in the form of projections or recesses on the surface of the ceramic layer have an edge course with a radius of curvature of at least 50 μm.

10. The metal-ceramic substrate according to claim 1, wherein the ceramic material of the ceramic layer is made of $Al_2O_3$ with 2-30 percent $ZrO_2$ by weight, in relation to a total weight of the ceramic material.

11. The metal-ceramic substrate according to claim 1, wherein the ceramic material of the ceramic layer contains at least one additive from the group yttrium oxide, ceroxide, calcium oxide or magnesium oxide, in a total concentration of 1-10 percent by weight, and in relation to a total weight of the ceramic material.

12. The metal-ceramic substrate according to claim 1, wherein the ceramic layer is $Al_2O_3$.

13. The metal-ceramic substrate according to claim 1, wherein the ceramic layer is made of AlN or $Si_3N_4$, and intermediate layers of $Al_2O_3$ are applied to the surface sides of the ceramic layer with a thickness of less than 10 μm.

* * * * *